(12) United States Patent
Kariya et al.

(10) Patent No.: US 8,093,508 B2
(45) Date of Patent: Jan. 10, 2012

(54) PRINTED WIRING BOARD AND METHOD OF MANUFACTURING THE SAME

(75) Inventors: Takashi Kariya, Ibi-gun (JP); Akira Mochida, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/758,908

(22) Filed: Apr. 13, 2010

(65) Prior Publication Data

US 2010/0193227 A1 Aug. 5, 2010

Related U.S. Application Data

(60) Continuation of application No. 11/964,355, filed on Dec. 26, 2007, now Pat. No. 7,856,710, which is a division of application No. 11/615,495, filed on Dec. 22, 2006, now Pat. No. 7,480,150, which is a continuation of application No. PCT/JP2005/012146, filed on Jun. 24, 2005.

(30) Foreign Application Priority Data

Jun. 25, 2004 (JP) ................................. 2004-188855

(51) Int. Cl.
*H05K 1/16* (2006.01)
*H05K 1/11* (2006.01)

(52) U.S. Cl. .......................... 174/262; 361/763; 174/260

(58) Field of Classification Search .......... 174/262–266, 174/260; 361/792–795, 761–764
See application file for complete search history.

(56) References Cited

U.S. PATENT DOCUMENTS

| | | |
|---|---|---|
| 5,387,888 A | 2/1995 | Eda et al. |
| 5,745,333 A | 4/1998 | Frankeny et al. |
| 6,005,197 A | 12/1999 | Kola et al. |
| 6,218,729 B1 | 4/2001 | Zavrel et al. |
| 6,274,224 B1 | 8/2001 | O'Bryan et al. |
| 6,512,182 B2 | 1/2003 | Takeuchi et al. |
| 6,677,630 B1 | 1/2004 | Kanaya et al. |
| 6,822,170 B2 | 11/2004 | Takeuchi et al. |
| 6,910,266 B2 | 6/2005 | Lee et al. |
| 6,952,049 B1 | 10/2005 | Ogawa et al. |
| 6,970,363 B2 | 11/2005 | Bassett et al. |
| 2001/0026444 A1 | 10/2001 | Matsushima et al. |
| 2003/0215619 A1 | 11/2003 | Ooi et al. |
| 2004/0108134 A1 | 6/2004 | Borland et al. |
| 2004/0231885 A1 | 11/2004 | Borland et al. |
| 2009/0200073 A1 | 8/2009 | Mano et al. |

FOREIGN PATENT DOCUMENTS

| | | |
|---|---|---|
| CN | 1458815 A | 11/2003 |
| EP | 0563873 A2 | 10/1993 |
| JP | 2-177350 A | 7/1990 |
| JP | 6-291520 | 10/1994 |
| JP | 8-213758 | 8/1996 |
| JP | 2002-536825 | 10/2002 |
| JP | 2003-197463 A | 7/2003 |
| JP | 2003-332752 | 11/2003 |
| JP | 2004-87971 | 3/2004 |
| WO | WO 00/45624 A1 | 8/2000 |

*Primary Examiner* — Jeremy Norris
(74) *Attorney, Agent, or Firm* — Oblon, Spivak, McClelland, Maier & Neustadt, L.L.P.

(57) ABSTRACT

A printed wiring board including a first insulating layer, a second insulating layer formed over the first insulating layer, a capacitor portion including an upper electrode, a lower electrode and a ceramic high dielectric layer formed between the upper electrode and the lower electrode, the capacitor portion sandwiched by the first insulating layer and the second insulating layer, an upper electrode connecting portion passing through the capacitor portion without contact and through the second insulating layer and electrically connected to the upper electrode of the capacitor portion, and a lower electrode connecting portion passing through the second insulating layer and the upper electrode of the capacitor portion without contact and electrically connected to the lower electrode in contact.

8 Claims, 9 Drawing Sheets

PRINTED WIRING BOARD AND METHOD OF MANUFACTURING THE SAME

CROSS-REFERENCE TO RELATED APPLICATIONS

This application is a continuation of and claims benefit of priority under 35 U.S.C. §120 from U.S. application Ser. No. 11/964,355, filed Dec. 26, 2007, the entire contents of which are hereby incorporated by reference. U.S. application Ser. No. 11/964,355 is a division of and claims the benefit of priority under 35 U.S.C. §120 from U.S. Ser. No. 11/615,495, filed Dec. 22, 2006, which is a continuation of International Application No. PCT/JP2005/012146, filed on Jun. 24, 2005, which claims priority from Japanese Patent Application No. 2004-188855, filed on Jun. 25, 2004.

TECHNICAL FIELD

The present invention relates to a printed wiring board and a method of manufacturing the same, and particularly to a printed wiring board containing a capacitor portion having a structure that a ceramic high-dielectric layer is sandwiched between an upper electrode and a lower electrode, a semiconductor device being mounted on the printed wiring board, and a method of manufacturing the printed wiring board.

BACKGROUND ART

There have been proposed various structures for a printed wiring board having a build-up portion that is electrically connecting a plurality of wire patterns laminated via insulating layers to each other through via holes. For example, with respect to this type of printed wiring board, when a semiconductor device mounted thereon is turned on and off at high speed, switching noise occurs and thus the potential of a power supply line is instantaneously reduced in some cases. In order to suppress such instantaneous reduction of the potential, it has been proposed that a capacitor portion is connected between the power supply line and the ground line for decoupling.

For example, Japanese Published Unexamined Patent Application No. 2004-87971 has proposed that a thin film capacitor portion is contained in a printed wiring board (see FIG. 21). In this publication, a laminate body 106 containing an exfoliation layer 101, an electrode layer 102, a dielectric layer 103, an electrode layer 104 and an insulating layer 105 which are laminated on a silicon wafer 100 in this order is prepared (see FIG. 21 (a)), and two filled vias 107 and 108 are formed in the insulating layer 105. Subsequently, a substrate 110 having a ground electrode 111 and a power supply electrode 112 is separately prepared, and the laminate body 106 is turned over and adhesively attached to the substrate 110 so that the filled vias 107 and 108 face the electrodes 111 and 112, respectively (see FIG. 21 (b)). Thereafter, the capacitor portion 113 (the portion including the three layers of the electrode layer 102, the dielectric layer 103 and the electrode layer 104) is patterned into a predetermined shape (see FIG. 21 (c)), and a polyimide layer 114 coating the capacitor portion 113 is formed. A hole is formed so as to extend from the upper surface of the polyimide layer 114 to the electrode layer 102, and then the hole is filled with electrically conductive paste to form a filled via 115. Furthermore, likewise, a hole is formed so as to extend from the upper surface of the polyimide layer 114 to the filled via 108, and then the hole is filled with electrically conductive paste to form a filled via 116 (see FIG. 21(d)). The filled vias 115 and 116 are connected to each other by an outer layer pattern 117, whereby charges are supplied from the power supply electrode 112 to the electrode layer 102 of the capacitor portion 113.

DISCLOSURE OF THE INVENTION

However, in the publication described above, the electrode layer 104 of the capacitor portion 113 is connected to the ground electrode 111 via the filled via 107 extending just to the lower side thereof, and thus it is impossible to form the capacitor portion 113 in process of build-up. Therefore, as shown from FIG. 21(a) to FIG. 21(b), it is necessary to form the laminate body 106 separately from the build-up process and then turn over the laminate body 106 so that the electrodes 111 and 112 of the substrate 110 face the filled vias 107 and 108, so that the manufacturing processing is complicated.

The present invention has been implemented in view of the foregoing problem, and has an object to provide a printed wiring board in which a capacitor portion can be formed in process of build-up. Furthermore, the present invention has an object to provide a method suitable for manufacturing a printed wiring board as described above.

In order to attain at least part of the above-described objects, the present invention uses the following means.

A printed wiring board of the present invention contains a capacitor portion in which a structure that a ceramic high-dielectric layer is sandwiched between an upper electrode and a lower electrode, and mounts a semiconductor element thereon, the printed wiring board including: an upper electrode connecting portion penetrating through the capacitor portion in top to bottom direction in contact with neither the upper electrode of the capacitor portion nor the lower electrode of the capacitor portion, and passing through a conductor layer provided above the capacitor portion so as to be electrically connected to the upper electrode of the capacitor portion; and a lower electrode connecting portion penetrating through the capacitor portion in top to bottom direction so as not to come into contact with the upper electrode, but to come into contact with the lower electrode.

In the printed wiring board described above, the upper electrode connecting portion connected to the upper electrode of the capacitor portion penetrates through the capacitor portion in top to bottom direction without coming into contact with the capacitor portion, passes through the conductor layer provided at the upper side of the capacitor portion and connects to the upper electrode. Furthermore, the lower electrode connecting portion connected to the lower electrode of the capacitor portion is not in contact with the upper electrode of the capacitor, however, it is in contact with the lower electrode. Therefore, in process of build-up, even when the whole surface of the printed wiring board is covered by a high-dielectric capacitor sheet that has a structure containing a high-dielectric layer sandwiched by two metal foils and will afterwards serve as the capacitor portion, the upper electrode connecting portion and the lower electrode connecting portion can be formed thereafter. Alternatively, after a metal foil, a ceramic high-dielectric layer and a metal foil are laminated in this order in process of build-up so as to cover the whole surface, the upper electrode connecting portion and the lower electrode connecting portion may be formed. As described above, according to the printed wiring board of the present invention, the capacitor portion can be formed in process of build-up.

In this specification, "up/upper" and "down/lower" are expressed, however, these terms express the relative positional relationship for convenience. For example, "up/upper"

and "down/lower" may be replaced by each other, or "up/upper" and "down/lower" may be replaced with "right" and "left."

In the printed wiring board of the present invention, the capacitor portion is preferably formed by a separately-formed high-dielectric capacitor sheet that is prepared to have the structure that the high-dielectric layer is sandwiched between the upper electrode and the lower electrode, and have the same size as the surface of the printed wiring board to be manufactured. In general, the printed wiring plate is often built up under the temperature condition of 200° C. or less, and thus it is difficult to fire high dielectric material at high temperatures (for example, 600 to 950° C.) and make ceramic material in process of build-up. Therefore, it is preferable to fire high dielectric material at high temperatures separately and make a ceramic high-dielectric layer.

In the printed wiring board of the present invention, the upper electrode connecting portion is electrically connected to either one of a power supply terminal and ground terminal of the semiconductor element, and the lower electrode connecting portion is electrically connected to the other of the ground terminal and the power supply terminal of the semiconductor element. With this construction, even under a condition that the on/off frequency of the semiconductor element is as high as several GHz to several tens GHz (for example, 3 GHz to 20 GHz) and the instantaneous reduction of the potential is liable to occur, a sufficient decoupling effect can be exhibited. In this embodiment, with respect to the upper electrode connecting portion, it is preferable that the lower end portion penetrating through the capacitor portion in top to bottom direction is electrically connected to either one of a power supply conductor or a ground conductor. Furthermore, it is preferable that the lower electrode connecting portion is electrically connected to the ground terminal or power supply terminal of the semiconductor element, and also the lower end portion thereof penetrating through the capacitor portion in top to bottom direction is electrically connected to the other of the ground conductor and the power supply terminal.

In the printed wiring board of the present invention, the high dielectric layer is preferably manufactured by firing a raw material containing metal oxide of at least one kind selected from the group consisting of barium titanate (BaTiO$_3$), strontium titanate (SrTiO$_3$), tantalum oxide (TaO$_3$, Ta$_2$O$_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT). These materials have high dielectric constants, and thus the electrical capacitance of the capacitor portion is increased, so that the sufficient decoupling effect is more easily achieved.

In the printed wiring board of the present invention, the upper electrode and the lower electrode are preferably formed as solid patterns. This construction makes it possible to increase the areas of the upper and lower electrodes of the capacitor portion, so that the electrical capacitance of the capacitor portion is increased. Each solid pattern is preferably provided to the substantially whole plate surface of the wiring board, however, it may not be provided to the substantially whole surface, and may be provided to a part of the surface.

In the printed wiring board of the present invention, the distance between the upper electrode and the lower electrode in the capacitor portion is preferably 10 μm or less so that they are substantially not short-circuited by each other. With this construction, the inter-electrode distance of the capacitor portion is sufficiently small, and thus the electrical capacitance of the capacitor portion can be increased.

A method of manufacturing a printed wiring plate according to the present invention includes: (a) attaching a separately-manufactured high-dielectric capacitor sheet that is prepared to have the structure that a ceramic high-dielectric layer is sandwiched by two metal foils onto a first electrically insulating layer; (b) forming an upper electrode sheet through hole and a lower electrode sheet through hole so that the upper and lower electrode sheets penetrate through the high-dielectric capacitor sheets in top to bottom direction; (c) forming a second electrical insulating layer so that the second electrical insulating layer fills both the sheet through holes and covers the upper surface of the high-dielectric capacitor sheet; (d) forming an upper electrode connecting first hole opened from the second electrical insulating layer to the upper electrode, an upper electrode connecting second hole that is opened from a part of the second electrical insulating layer just above the upper electrode sheet through hole to the first electrical insulating layer so that each of the upper electrode, the high-dielectric layer and the lower electrode is not exposed to the inner wall of the upper electrode connecting second hole, and forming a lower electrode connecting hole opened from a portion of the second electrical insulating layer just above the lower electrode sheet through hole to the first electrical insulating layer so that the upper electrode is not exposed to the inner wall of the lower electrode connecting hole and the lower electrode is exposed to the inner wall of the lower electrode connecting hole; and (e) filling the upper electrode connecting first hole and the upper electrode connecting second hole with conductive material, and connecting the upper electrode connecting first hole and the upper electrode connecting second hole to each other at the upper side of the second insulating layer to form an upper electrode connection portion, and filling the lower electrode connecting hole with conductive material to form a lower electrode connecting portion.

According to the method of manufacturing the printed wiring board, the high-dielectric capacitor sheet is attached onto the first electrical insulating layer, and then the upper electrode sheet through hole and the lower electrode sheet through hole are formed from the upper side of the high dielectric capacitor sheet. The second electrical insulating layer that fills the respective sheet through holes and covers the upper surface of the high dielectric capacitor sheet is formed, and the upper electrode connecting first and second holes and the lower electrode connecting hole are formed from the second electrical insulating layer, the upper electrode connecting first and second holes are filled with the conductive material to be connected to each other, thereby setting the upper electrode connecting portion, and also the lower electrode connecting hole is filled with the conductive material to set the lower electrode connecting portion. Finally, there is prepared a printed wiring board containing a capacitor portion having a structure that the high dielectric layer is sandwiched between the upper electrode and the lower electrode. As described above, in process of the build-up, the upper electrode connecting portion and the lower electrode connecting portion may be formed after the whole surface is covered by the high dielectric capacitor sheet.

In the method of manufacturing the printed wiring board of the present invention, in the step (b), the hole diameter of the lower electrode sheet through hole is preferably larger at a part thereof passing through the upper electrode than at a part thereof passing through the lower electrode. With this construction, when the lower electrode connecting hole is formed in the step (d) after the step (c), it can be easily implemented that the upper electrode is not exposed to the inner wall of the lower electrode connecting hole, but the lower electrode is exposed to the inner wall of the lower electrode connecting hole. The lower electrode sheet through hole as described above may be formed as follows. For example, the predetermined area out of the upper electrode is removed by etching or the like, and then the high dielectric layer and the lower electrode existing in the region corresponding to the predetermined area are removed by an area smaller than the predetermined area by etching or the like.

In the method of manufacturing the printed wiring board of the present invention, it is preferable that in the step (d), the upper electrode connecting second hole is opened from the part of the second electrical insulating layer just above the upper electrode sheet through hole to either one of the power supply conductor and the ground conductor in the first electrical insulating layer, and the lower electrode connecting hole is opened from the part of the second electrical insulating layer just above the lower electrode sheet through hole to the other of the ground terminal and the power supply conductor in the first electrical insulating layer. Furthermore, it is preferable that after the step (e), connecting the upper electrode connecting portion electrically to either one of the power terminal and the ground terminal of the semiconductor element mounted on the printed wiring board, and connecting the lower electrode connecting portion electrically to the other of the ground terminal and the power supply terminal of the semiconductor element. With this construction, the on/off frequency of the semiconductor element is as high a frequency as several GHz to several tens GHz, and a sufficient decoupling effect can be exhibited even under such a situation that instantaneous reduction is liable to occur.

In the method of manufacturing the printed wiring board of the present invention, the high dielectric layer is preferably manufactured by firing a raw material containing metal oxide of at least one kind selected from the group consisting of barium titanate ($BaTiO_3$), strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), and lead strontium zirconate titanate (PSZT). These materials have high dielectric constants, and thus the electrical capacitance of the capacitor portion is increased, so that the sufficient decoupling effect is more easily achieved.

In the method of manufacturing the printed wiring board of the present invention, the distance between the upper electrode and the lower electrode in the capacitor portion is preferably 10 μm or less so that they are not short-circuited by each other. With this construction, the inter-electrode distance of the capacitor portion is sufficiently small, and thus the electrical capacitance of the capacitor portion can be increased.

BEST MODE FOR CARRYING OUT THE INVENTION

Figure 1:
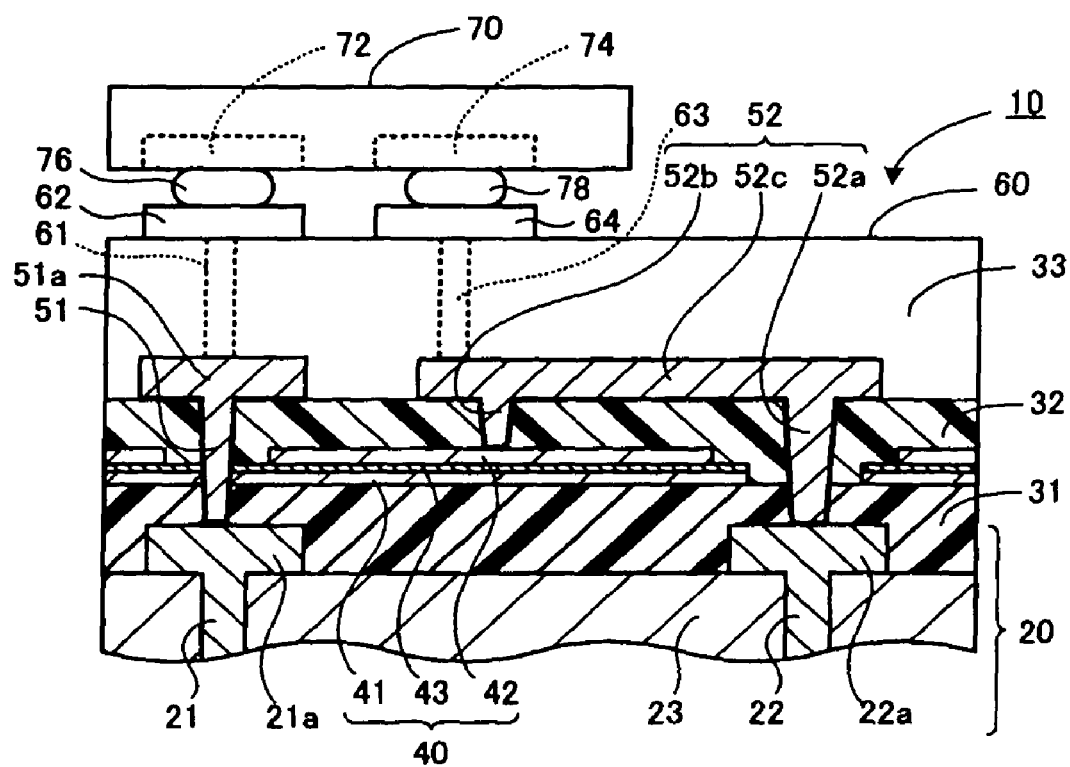
FIG. 1 is a cross-sectional view showing the construction of a printed wiring board 10.

Next, embodiments of the present invention will be described with reference to the drawings. FIG. 1 is a cross-sectional view showing the construction of a printed wiring board 10 according to an embodiment of the present invention.

The printed wiring board 10 of this embodiment is a so-called build-up multilayer printed wiring board, and it contains a capacitor portion 40 having a structure that a high dielectric layer 43 of a ceramic material is sandwiched by a lower electrode 41 and an upper electrode 42. A ground terminal 72 and a power supply terminal 74 of a semiconductor device (IC chip) 70 operating at frequencies of several GHz to several tens GHz are electrically connected via solder bumps 76 and 78 to a ground pad 62 and a power supply pad 64 formed on the mount surface 60 of the printed wiring board 10.

The capacitor portion 40 is formed on a first electrical insulating layer 31 formed at the upper portion of a build-up portion 20, and a second electrical insulating layer 32 is formed at the upper portion of the capacitor portion 40. Here, the build-up portion 20 is a multilayer portion prepared by forming an insulating layer on a core board and then laminating conductor layers (more than 10 μm to less than 20 μm in thickness, for example) while carrying out interlayer connection. However, a description thereof is omitted because this is well known by persons skilled in the art. However, in this embodiment, the build-up portion 20 is equipped with the ground conductor 21 that extends in top to bottom direction in the insulating layer 23 and has a ground land 21a on the upper surface thereof, and a power supply conductor 22 that extends in top to bottom direction in the insulating layer 23 and has a power supply land 22a on the upper surface thereof.

The lower electrode 41 of the capacitor portion 40 is a solid pattern formed of copper foil (20 to 50 μm in thickness, for example), and covers substantially the whole surface of the upper surface of the first electrical insulating layer 31 although it is partially removed by etching or the like. This lower electrode 41 is electrically connected to a lower electrode connecting portion 51. The lower electrode connecting portion 51 penetrates from the upper surface of the second electrical insulating layer 32 through the capacitor portion 40 in top to bottom direction and reaches the ground land 21a of the ground conductor 21 formed on the upper surface of the build-up portion 20 so that the lower electrode connecting portion 51 is not in contact with the upper electrode 42 of the capacitor portion 40, but is in contact with the lower electrode 41. The upper end side of the lower electrode connecting portion 51 is a wire pattern 51a, and the wire pattern 51a is formed on the upper surface of the second electrical insulating layer 32 and electrically connected to the ground pad 62 provided to the mount surface 60. As described above, the lower electrode 41 is connected to the ground conductor 21 and the ground pad 62 via the lower electrode connecting portion 51.

Here, it is not necessarily required to form the same number of lower electrode connecting portions 51 as the ground pads 62. If the ground pads 62 are electrically connected to each other by a conductor layer above the upper electrode 42, existence of at least one lower electrode connecting portion 51 connected to a ground pad 62 allows all the ground pads 62 to be electrically connected to the ground conductor 21 via the lower electrode connecting portion 51. With this construction, the number of holes in the upper electrodes 42 (the holes through which the lower electrode connecting portions 51 penetrate through the upper electrodes 42 without coming into contact with the upper electrodes 42) is reduced, and thus the area of the upper electrodes 42 can be increased.

The upper electrode 42 of the capacitor portion 40 is a solid pattern formed of copper foil, and it is formed to have substantially the same area as the lower electrode 41 although it is partially removed by etching or the like. The upper electrode 42 is electrically connected to the upper electrode connecting portion 52. The upper electrode connecting portion 52 includes first to third parts 52a to 52c of the upper electrode connecting portion. The first part 52a of the upper electrode connecting portion penetrates from the upper surface of the second electrical insulating layer 32 through the capacitor portion 40 in top to bottom direction without coming into contact with either the lower electrode 41 nor the upper electrode 42 of the capacitor portion 40, and reaches the power supply land 22a of the power supply conductor 22 formed on the upper surface of the build-up portion 20. Furthermore, the second part 52b of the upper electrode connecting portion is formed so as to reach the upper electrode 42 of the capacitor portion 40 from the upper surface of the second electric insulating layer 32. Furthermore, the third part 52c of the upper electrode connecting portion is formed so as to electrically connect the first part 52a of the upper electrode connecting portion and the second part 52b of the upper electrode connecting portion on the upper surface of the second electrical insulating layer 32. In this case, the third part 52c of the upper electrode connecting portion is formed as a wire pattern. Furthermore, in the upper electrode connecting portion 52, the third part 52c of the upper electrode connecting portion is electrically connected to the power supply pad 64 provided onto the mount surface 60, and the lower end of the first part 52a of the upper electrode connecting portion is electrically connected to the power supply conductor 22 formed in the build-up portion 20. As described above, the upper electrode 42 is connected to the power supply conductor 22 and the power supply pad 64 via the upper electrode connecting portion 52.

Here, it is not necessarily required that the number of first parts 52a of the upper electrode connecting portions is set to the same as the power supply pads 64. If the power supply pads 64 are electrically connected to each other by a conductor layer above the upper electrode 42, existence of at least one upper electrode connecting portion first part 52a connected to a power supply pad 64 allows all the power supply pads 64 to be electrically connected to the power supply conductor 22 via the upper electrode connecting portion first part 52a. With this construction, the number of holes in the lower electrodes 41 and the upper electrodes 42 (the holes through which the upper electrode connecting portion first parts 52a penetrate through both the electrodes 41 and 42 without coming into contact with both the electrodes 41 and 42) is reduced, and thus the area of both the electrodes 41 and 42 can be increased.

The high dielectric layer 43 of the capacitor portion 40 is formed of ceramic material prepared by firing high dielectric material at high temperatures (for example, 600 to 950° C.). Specifically, the ceramic material is prepared by forming high dielectric material containing metal oxide of one kind or two or more kinds selected from the group consisting of $BaTiO_3$, $SrTiO_3$, $TaO_3$, $Ta_2O_5$, PZT, PLZT, PNZT, PCZT and PSZT into a thin film of 0.1 to 10 μm in thickness and then firing the thin film. The high dielectric layer 43 is in contact with the lower electrode connecting portion 51, but not in contact with the upper electrode connecting portion 52.

The ground pad 62 is formed so as to be exposed to the mount surface 60, and electrically connected to a via hole 61 extending in top to bottom direction in an insulating layer 33 formed on the upper surface of the second electrical insulating layer 32. The ground pad 62 is electrically connected to the ground terminal 72 formed on the back surface of the semiconductor device 70 via the solder bump 76. The via hole 61 is formed so that the lower electrode connecting portion 51 and the ground pad 62 are interlayer-connected to each other.

The power supply pad 64 is formed so as to be exposed to the mount surface 60, and electrically connected to a via hole 63 extending in top to bottom direction in the insulating layer 33 formed on the upper surface of the second insulating layer 32. The power supply pad 64 is electrically connected to the power supply terminal 74 formed on the back surface of the semiconductor device 70 via a solder bump 78. The via hole 63 is formed so as to interlayer-connect the upper electrode connecting portion 52 and the power supply pad 64.

A solder resist layer may be formed on the mount surface 60, and the ground pad 62 and the power supply pad 64 may be exposed from the solder resist layer to the outside.

Next, an example of use of the thus constructed printed wiring board 10 will be described. First, the semiconductor device 70 having a large number of solder bumps 76 and 78 arranged on the back surface thereof is mounted on the mount surface 60 of the printed wiring board 10. At this time, the ground terminal 72, the power supply terminal 74 and a signal terminal (not shown) of the semiconductor device 70 are mounted in connection with the ground pad 62, the power supply pad 64 and a signal pad (not shown) on the mount surface 60, respectively. Subsequently, each terminal is joined to each pad via a solder bump by reflow. Thereafter, the printed wiring board 10 is joined to another printed wiring board such as a motherboard. At this time, solder bumps are formed on the pads formed on the back surface of the printed wiring board 10 in advance, and then these solder bumps are joined to the corresponding pads on the other printed wiring board by reflow while these solder bumps and the pads are in contact.

Here, power is supplied from the power supply conductor 22 of the build-up portion 20 to the power supply terminal 74 of the semiconductor device 70 via the upper electrode connecting portion 52, the via hole 63, the power supply pad 64 and the solder bump 78. Furthermore, charges are supplied from the upper electrode connecting portion 52 to the upper electrode 42 of the capacitor portion 40. Meanwhile, the ground terminal 72 of the semiconductor device 70 is grounded via the solder bump 76, the ground pad 62, the via hole 61, the lower electrode connecting portion 51 and the ground conductor 21 of the build-up portion 20. Furthermore, the lower electrode 41 of the capacitor portion 40 is also grounded via the lower electrode connecting portion 51. Accordingly, positive charges are accumulated in the upper electrode 42 of the capacitor portion 40, and negative charges are accumulated in the lower electrode 41. The electrical capacitance C of the capacitor portion 40 is represented by $C = \in S/d$ ($\in$: the dielectric constant of the high dielectric layer 43, S: the area of electrode, d: the distance between electrodes). In this embodiment, the dielectric constant $\in$ of the high dielectric layer 43 is large because it is formed of ceramic material such as barium titanate, and the electrode area S is as large as substantially the whole surface of the plate surface of the wiring board is occupied since both the electrodes 41 and 42 which are solid patterns. Furthermore, the distance d between the electrodes is as small as 1 μm, and thus a sufficiently large value can be achieved as the electrical capacitance C. Furthermore, since the capacitor portion 40 is contained almost directly below the semiconductor device 70, and thus the wire pull-out distance of the capacitor portion 40 and the semiconductor device 70 is shorter than the wire pull-out distance of a chip capacitor (which is normally disposed near the semiconductor device 70 on the mount surface 670) and the semiconductor device 70.

Next, an example of the manufacturing process of the printed wiring board 10 of this embodiment will be described with reference to FIG. 2 to FIG. 19. FIG. 2 to FIG. 19 are diagrams showing the manufacturing procedure of the capacitor portion. In this case, the core board having the build-up portion 20 formed on one surface thereof is used as shown in FIG. 4. The manufacturing process of the build-up portion 20 is well known (for example, see "BUILD-UP MULTILAYER PRINTED WIRING BOARD TECHNIQUE" issued by Nikkan Kogyo Shinbun, Ltd. (authored by Kiyoshi Takagi) on Jun. 20, 2000). Therefore, description of the manufacturing process is omitted, and the manufacturing process of the capacitor portion will be mainly described.

Figure 2:
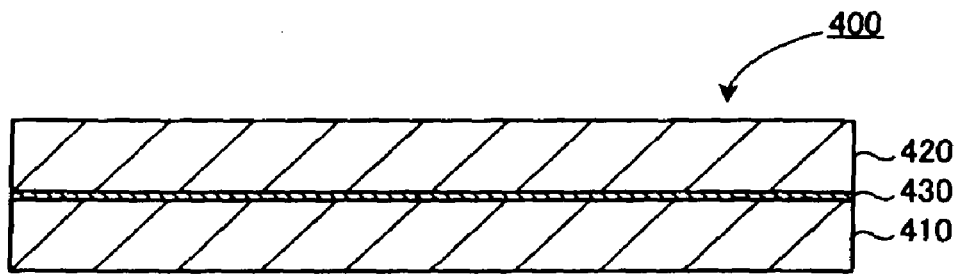
FIG. 2 is a cross-sectional view (part 1) showing the manufacturing procedure of the printed wiring board 10.

First, as shown in FIG. 2, a high dielectric capacitor sheet 400 in which a high dielectric layer 430 is sandwiched between two copper foils 410 and 420 is prepared. The high dielectric capacitor sheet 400 is manufactured as follows. That is, a high dielectric material containing metal oxide of one kind or two or more kinds selected from the group consisting of $BaTiO_3$, $SrTiO_3$, $TaO_3$, $Ta_2O_5$, PZT, PLZT, PNZT, PCZT and PSZT is printed as thin film of 1 to 10 μm (in this case, 1 μm) on a copper foil 410 of 30 to 100 μm in thickness by using a printing machine such as a roll coater or a doctor blade to achieve an unfired layer. After the printing, this unfired layer is fired in the temperature range from 600 to 950° C. under vacuum or non-oxidation atmosphere such as $N_2$ gas to achieve a high dielectric layer 430. Thereafter, a copper layer is formed on the high dielectric layer 430 by using a vacuum deposition device such as sputtering, and copper is additionally deposited on the copper layer by approximately 10 μm by electrolytic plating or the like, thereby forming copper foil 420.

Next, another example of the manufacturing process of the high dielectric capacitor sheet 400 will be described hereunder.

(1) In dried nitrogen, diethoxy barium and bitetra isopropoxide titan which were weighed to be 1.0 mol/liter in concentration was dissolved in mixed solvent (volume ratio 3:2) of dehydrated methanol and 2-methoxy ethanol, and stirred for three days under a nitrogen atmosphere at room temperature to prepare an alcoxide precursor composition solution of barium and titan. Subsequently, this precursor composition solution was stirred while kept at 0° C., and decarbonated water is sprayed under nitrogen flow at a rate of 0.5 microliter/minute to conduct hydrolysis.

(2) Sol-gel solution thus manufactured is passed through a 0.2 micron filter, and precipitate, etc., were filtrated.

(3) The filtrate manufactured in the step (2) was spin-coated onto the copper foil 410 of 30 to 100 μm in thickness (will subsequently serve as the lower electrode 41) at 1500 rpm for one minute. The board on which the solution was spin-coated was mounted on a hot plate kept at 150° C. for 3 minutes. Thereafter, the board was inserted into a electrical furnace held at 850° C., and fired for 15 minutes. Here, the viscosity of the sol-gel liquid was adjusted so that the film thickness achieved by single spin-coat/dry/firing was equal to 0.03 μm. Nickel, platinum, gold, silver or the like may be used as the lower electrode 141 in addition to copper.

(4) Spin-coat/dry/firing were repeated forty times to prepare the high dielectric layer 430 of 1.2 μm.

(5) Thereafter, a copper layer was formed on the high dielectric layer 430 by using a vacuum deposition device such as sputtering, and copper was added onto the copper layer by electrolytic plating or the like by approximately 10 μm to form the copper foil 420 (will afterwards serve as the upper electrode 42). The high dielectric capacitor sheet 400 was prepared as described above. When the dielectric characteristic was measured by using IMPEDANCE/GAIN PHASE ANALYZER (produced by Hewlett Packard Ltd., product name: 4194A) under the condition of a frequency of 1 kHz, temperature of 25° C. and OSC level of 1V, the relative permittivity was 1,850. A metal layer of platinum, gold or the like may be used in place of copper for the vacuum deposition and a metal layer such as nickel or tin may be formed in place of copper for the electrolytic plating. Furthermore, the high dielectric layer was formed of barium titanate. However, by using another sol-gel solution, the high dielectric layer may be formed of strontium titanate ($SrTiO_3$), tantalum oxide ($TaO_3$, $Ta_2O_5$), lead zirconate titanate (PZT), lead lanthanum zirconate titanate (PLZT), lead niobium zirconate titanate (PNZT), lead calcium zirconate titanate (PCZT), or lead strontium zirconate titanate (PSZT).

The following method may be adopted as another method of manufacturing the high dielectric capacitor sheet 400. That is, powder of barium titanate (produced by Fuji Titanium Industry Co., Ltd., HPBT series) was disposed in a binder solution prepared by mixing polyvinyl alcohol of 5 parts by weight, pure water of 50 parts by weight and dioctyl phthalate or dibutyl phthalate of one part by weight as solvent plasticizer with respect to the whole weight of the powder of barium titanate, and the dispersed solution was printed in the form of a thin film of 5 to 7 μm in thickness on the copper foil 410 of 30 to 100 μm in thickness (subsequently will serve as the lower electrode 41) by using a printing machine such as a roll coater, a doctor blade or α-coater, and dried for one hour at 60°, for 3 hours at 80° C., for one hour at 100° C., for one hour at 120° C., for three hours at 150° C. to prepare an unfired layer. In place of $BaTiO_3$, paste containing metal oxide of one kind or two or more kinds selected from the group consisting of $SrTiO_3$, $TaO_3$, $Ta_2O_5$, PZT, PLZT, PNZT, PCZT and PSZT may be printed in the form of a thin film of 0.1 to 10 μm in thickness by using a printing machine such as a roll coater or a doctor blade and then dried to prepare an unfired layer. After the printing, the unfired layer was fired in the temperature range from 600 to 950° C. to prepare the high dielectric layer 430. Thereafter, by using the vacuum deposition device such as sputtering, a copper layer was formed on the high dielectric layer 430, and copper was further added on the copper layer by approximately 10 μm by using electrolytic plating or the like, thereby forming the copper foil 420 (afterwards will serve as the upper electrode 42). A metal layer of platinum, gold or the like may be formed in place of copper for the vacuum deposition, and a metal layer of nickel, tin or the like may be formed in place of copper for the electrolytic plating. Furthermore, a sputtering method using barium titanate as a target may be used.

Figure 3:
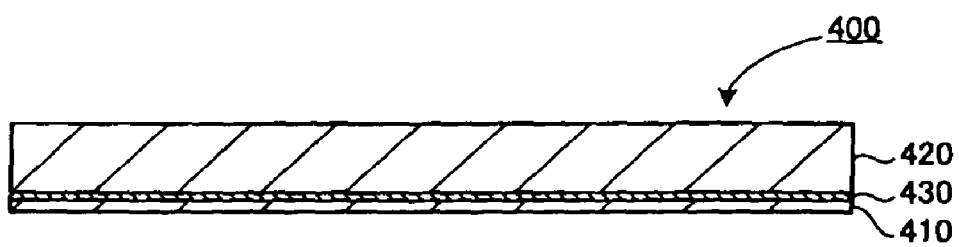
FIG. 3 is a cross-sectional view (part 2) showing the manufacturing procedure of the printed wiring board 10.
Figure 4:
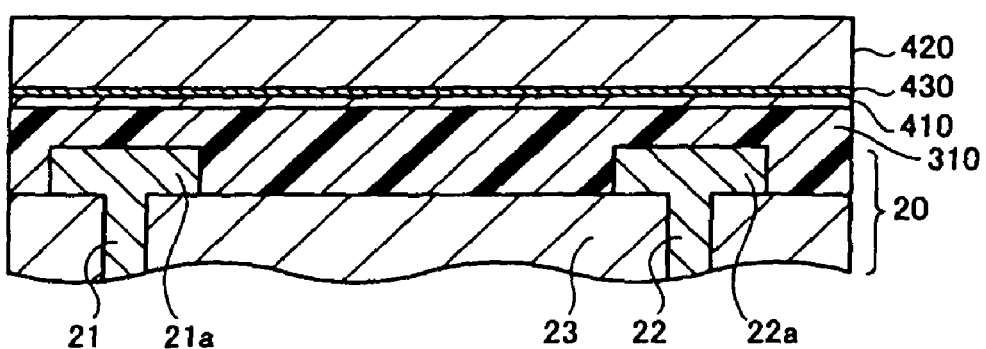
FIG. 4 is a cross-sectional view (part 3) showing the manufacturing procedure of the printed wiring board 10.

The copper foil 410 at one side of the thus prepared high dielectric capacitor sheet 400 was etched to prepare thin film of 20 to 50 μm, and the surface (lower surface) of the copper foil 410 after the etching was roughened (see FIG. 3).

Subsequently, the core board (not shown) having the build-up portion 20 formed thereon was prepared, and a thermosetting resin sheet 310 of the B stage (uncured) was laminated so as to cover the whole upper surface of the build-up portion 20, and then the surface-roughened copper foil 410 of the high dielectric capacitor sheet 400 (51 mm×51 mm) described above was attached onto the thermosetting resin sheet 310, and then the thermosetting resin sheet 310 was perfectly thermally cured (see FIG. 4). The build-up portion 20 was equipped with the ground conductor 21 and the power supply conductor 22 extending in top to bottom direction in the insulating layer 23, the ground land 21a that was formed on the upper surface of the build-up portion 20 and electrically connected to the ground conductor 21, and the power supply land 22a that was formed on the upper surface of the build-up portion 20 and electrically connected to the power supply conductor 22.

Figure 5:
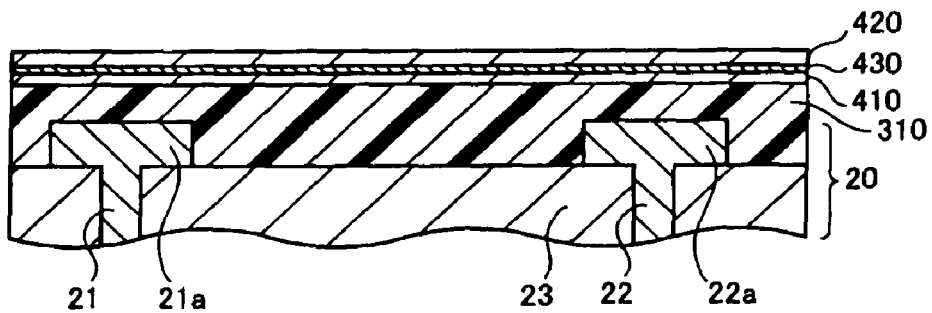
FIG. 5 is a cross-sectional view (part 4) showing the manufacturing procedure of the printed wiring board 10.

Subsequently, the copper foil 420 was etched to prepare a thin film of 20 to 30 μm in thickness (see FIG. 5). Dry film as a photosensitive resist was laminated on the copper foil 420, and it was exposed to light through a pattern mask and developed to form a patterned resist 312 (see FIG. 6). This patterning was executed so that the portion of the resist 312 just above the ground conductor 21 of the build-up portion 20 and the portion of the build-up portion 20 just above the power supply conductor 22 were removed. As a result, a resist opening portion 312-1 was formed just above the ground land 21a, and a resist opening portion 312-2 was formed just above the power supply land 22a. Thereafter, the copper foil 420 in the resist opening portions 312-1 and 312-2 was removed by etching (see FIG. 7). The etching was executed by using a mixture liquid of sulfuric acid and hydrogen peroxide as etchant so that only the copper foil 420 exposed to the outside was removed and the just-below high dielectric layer 430 was not removed. In this case, the dry film was used as a photosensitive resist, however, liquid resist may be used.

Figure 9:
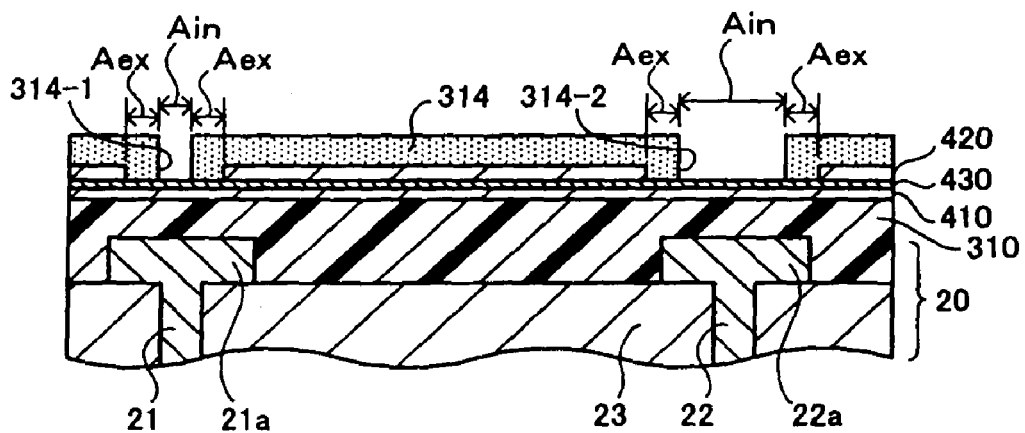
FIG. 9 is a cross-sectional view (part 8) showing the manufacturing procedure of the printed wiring board 10.
Figure 10:
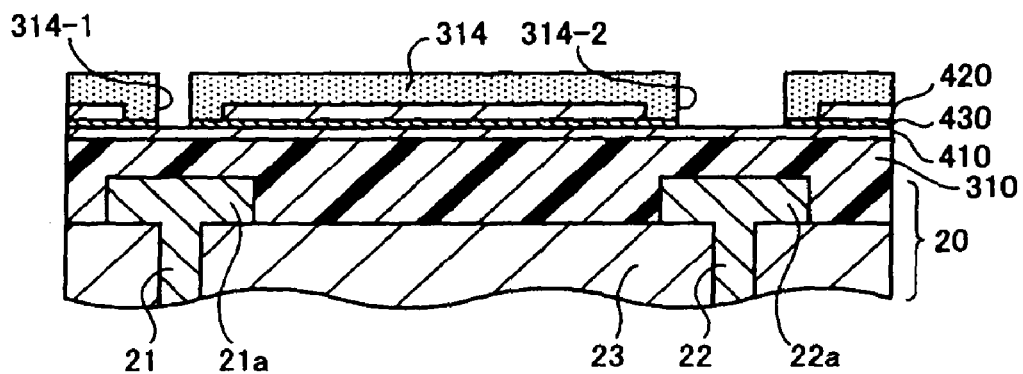
FIG. 10 is a cross-sectional view (part 9) showing the manufacturing procedure of the printed wiring board 10.
Figure 11:
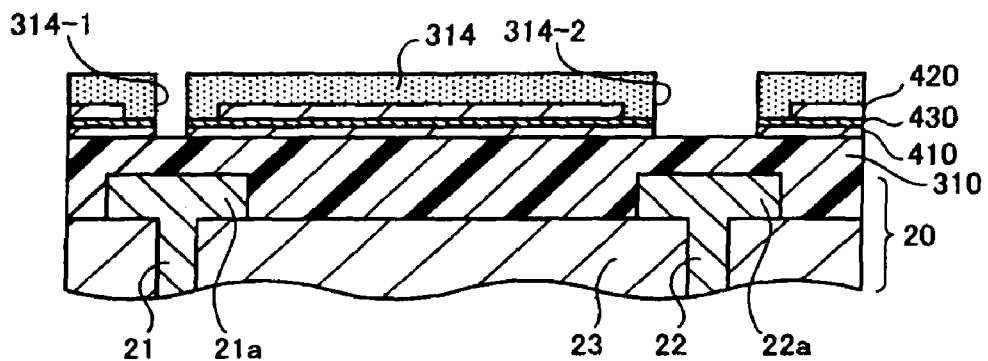
FIG. 11 is a cross-sectional view (part 10) showing the manufacturing procedure of the printed wiring board 10.

Subsequently, the resist 312 was removed (see FIG. 8), and dry film as a photosensitive resist was laminated, and then exposed to light through a pattern mask and developed to thereby form a patterned resist 314 (see FIG. 9). This patterning was carried out so that an interior peripheral area Ain out of the high dielectric layer 430 exposed to the outside was not covered by the dry film, and an exterior peripheral area Aex was covered by the dry film, so that a resist opening portion 314-1 was formed just above the ground land 21a, and a resist opening portion 314-2 was formed just above the power supply land 22a. Thereafter, the high dielectric layer 430 in the resist opening portions 314-1 and 314-2 was removed by etching (see FIG. 10). This etching was carried out by using hydrochloric acid as etchant so that only the high dielectric layer 430 was removed and the just-below copper foil 410 was not removed. Subsequently, the copper foil 410 in the resist opening portions 314-1 and 314-2 was removed by etching (see FIG. 11). This etching used copper chloride etchant as etchant. In this case, the dry film was also used as the photosensitive resist, however, liquid resist may be used. Furthermore, the high dielectric layer 430 and the copper foil 410 in the resist opening portions 314-1 and 314-2 in FIG. 9 may be etched at the same time.

Figure 12:
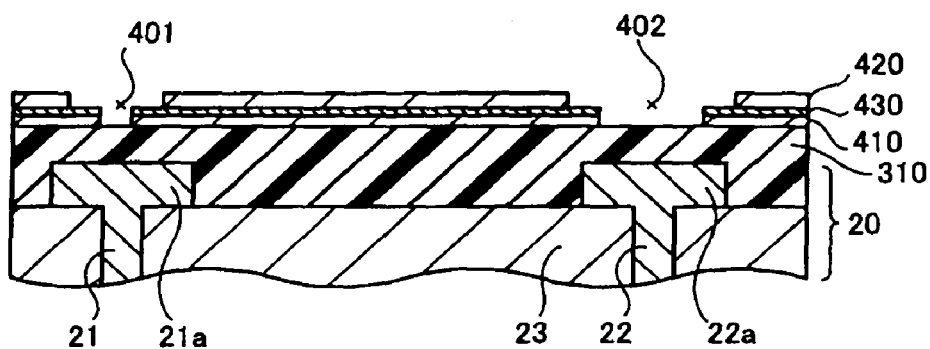
FIG. 12 is a cross-sectional view (part 11) showing the manufacturing procedure of the printed wiring board 10.

Thereafter, the resist 314 was removed (see FIG. 12). Accordingly, the sheet through holes 401 and 402 were formed just above the ground conductor 21 and the power supply conductor 22 in the high dielectric capacitor sheet 400. The sheet through hole 401 just above the ground conductor 21 was designed so that the part thereof penetrating through the copper foil 410 and the high dielectric layer 430 was small in diameter and the part thereof penetrating through the copper foil 420 was large in diameter, and also the sheet through hole 402 just above the power supply conductor 22 was designed so that the part thereof penetrating through the copper foil 410 and the high dielectric layer 430 was large in diameter, and the part thereof penetrating through the copper foil 420 was large still (the diameter of the lower electrode connecting portion 51<the diameter of the upper electrode connecting portion first part 52a).

Figure 13:
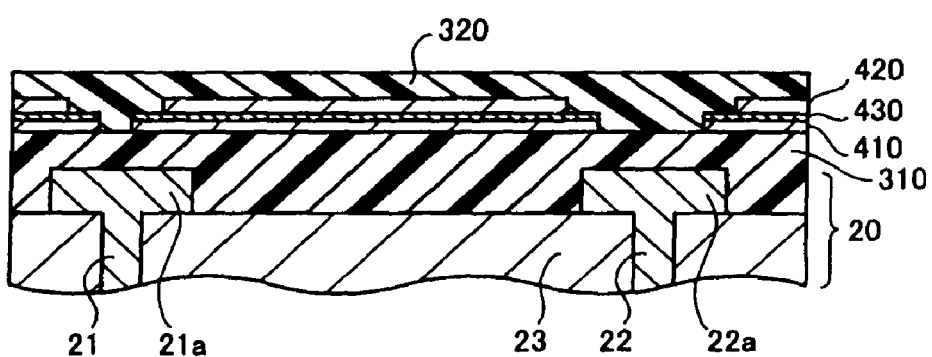
FIG. 13 is a cross-sectional view (part 12) showing the manufacturing procedure of the printed wiring board 10.
Figure 14:
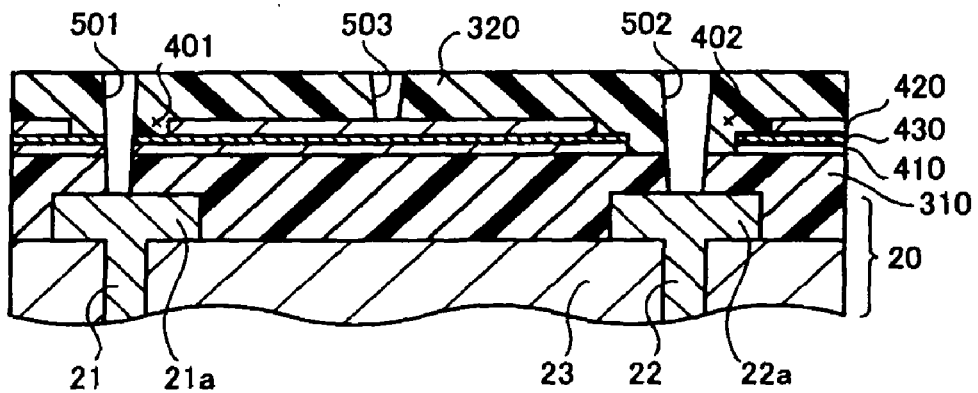
FIG. 14 is a cross-sectional view (part 13) showing the manufacturing procedure of the printed wiring board 10.

Subsequently, the thermosetting resin sheet 320 of B stage (uncured) (for example, ABF-45SH produced by Ajinomoto Co., Inc.) was laminated so as to cover the whole upper surface of the board being manufactured and perfectly thermoset (see FIG. 13). Hole making was performed at a predetermined position on the surface of the thermosetting resin sheet 320 by a carbon dioxide laser, UV laser, YAG laser, excimer laser or the like (see FIG. 14). In this case, a lower electrode connecting hole 501, an upper electrode connecting first hole 502 and an upper electrode connecting second hole 503 were formed. Specifically, the lower electrode connecting hole 501 was formed just above the ground conductor 21 until it reached the ground land 21a so that the copper foil 420 was not exposed to the inner wall of this hole 501, but the copper foil 410 was exposed to the inner wall of the hole 501. At this time, the hole diameter of the part of the sheet through hole 401 passing through the copper foil 420 was formed to be larger than the hole diameter of the part of the sheet through hole 401 passing through the copper foil 410, and thus it could be easily performed that the copper foil 420 was not exposed to the inner wall of the lower electrode connecting hole 501, but the copper foil 410 was exposed to the inner wall of the lower electrode connecting hole 501. Furthermore, the upper electrode connecting first hole 502 was formed just above the power supply conductor 22 so as to extend to the power supply land 22a so that neither the copper foil 410 nor the copper foil 420 was exposed to the inner wall of the hole 502. At this time, since the hole diameter of the sheet through hole was formed large in advance, it was easily performed that neither the copper foil 410 nor the copper foil 420 was exposed to the inner wall of the upper electrode connecting first hole 502. Furthermore, the upper electrode connecting second hole 503 was formed just above the copper foil 420 so as to reach the copper foil 420. After the holes were formed as described above, a desmearing treatment was carried out to remove smear, etc., in the holes 501 to 503. The surface of the thermosetting resin sheet 320 was roughened by the desmearing treatment.

Figure 6:
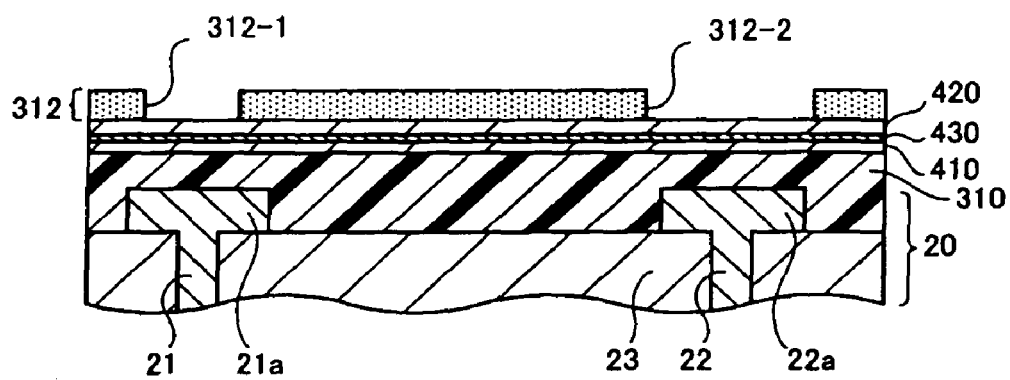
FIG. 6 is a cross-sectional view (part 5) showing the manufacturing procedure of the printed wiring board 10.
Figure 7:
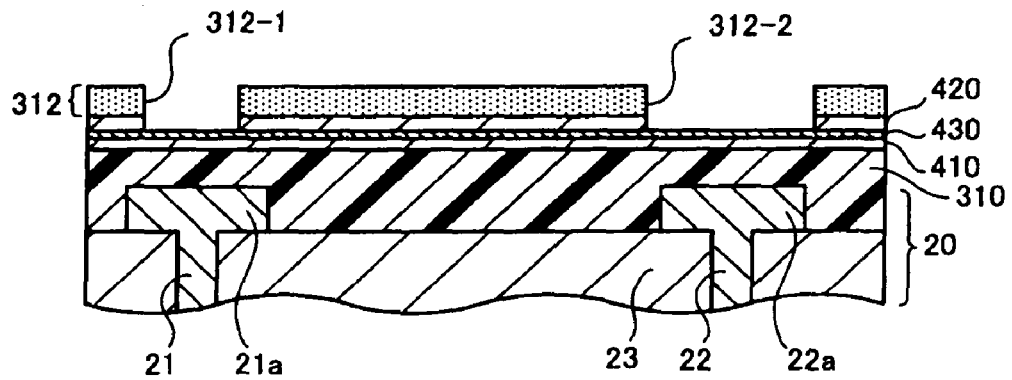
FIG. 7 is a cross-sectional view (part 6) showing the manufacturing procedure of the printed wiring board 10.
Figure 8:
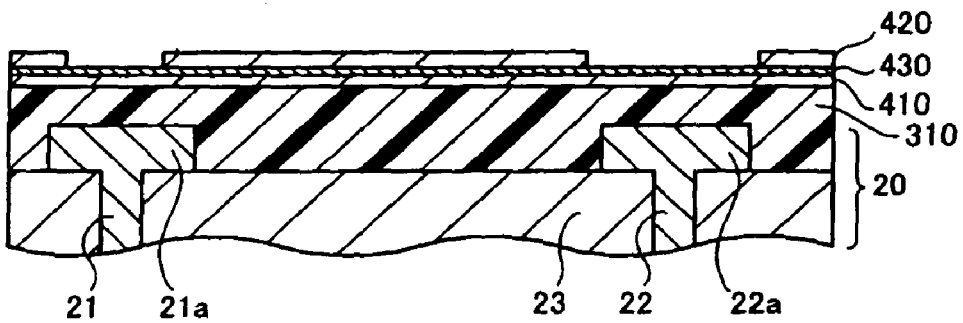
FIG. 8 is a cross-sectional view (part 7) showing the manufacturing procedure of the printed wiring board 10.

The numbers of lower electrode connecting portions 51 and the upper electrode connecting portion first parts 52a may be adjusted in accordance with the numbers of resist opening portions 312-1 and 312-2 in FIG. 6. For example, when the number of resist opening portions 312-1 and 312-2 is set to be smaller than the total number of terminals of the IC chip 70, the number of holes to be formed in the lower electrode 41 and the upper electrode 42 is reduced, and thus the area of each electrode is increased by the amount corresponding to the reduction of the number, so that the capacitance of the capacitor portion 40 is increased. Furthermore, the area of the lower electrode 41, the area of the upper electrode 42, and the space between the lower electrode connecting portion 51 and the copper foil 420, and the space between the upper electrode connecting portion first part 52a and the copper foils 410 and 420 can be adjusted by the sizes of the resist opening portions 312-1, 312-2, 314-1 and 314-2. The sizes of the resist opening portions 312-1, 312-2, 314-1 and 314-2 may be identified with the sizes of the holes to be formed in the lower electrode 41 and the upper electrode 42, and thus the sizes of the respective electrodes may be regarded as a factor for adjusting the capacitance of the capacitor portion 40.

Figure 15:
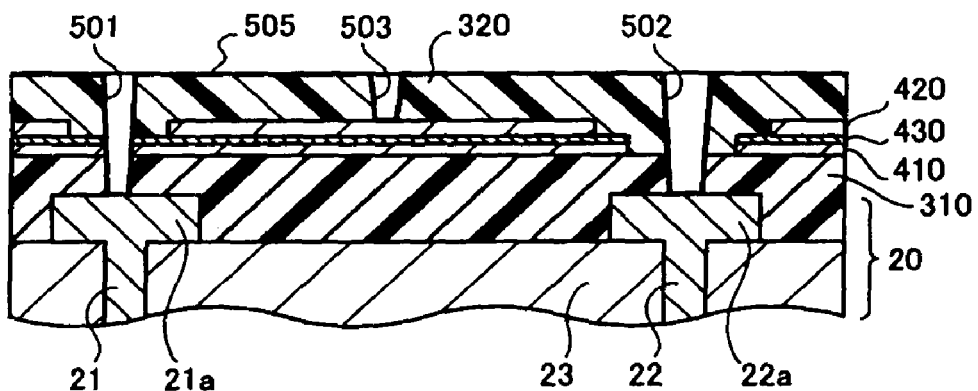
FIG. 15 is a cross-sectional view (part 14) showing the manufacturing procedure of the printed wiring board 10.
Figure 16:
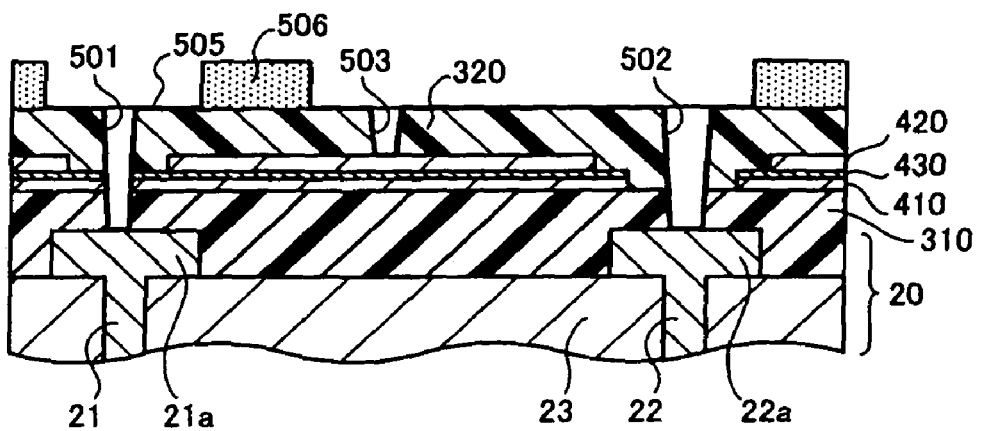
FIG. 16 is a cross-sectional view (part 15) showing the manufacturing procedure of the printed wiring board 10.
Figure 17:
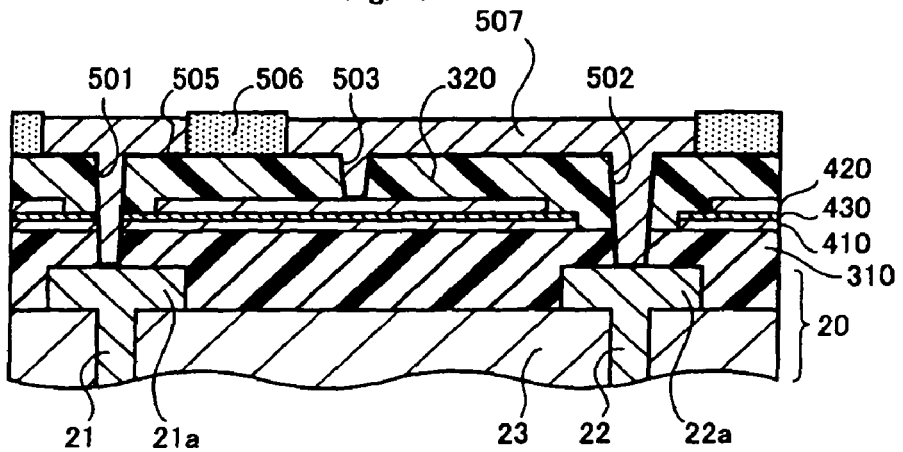
FIG. 17 is a cross-sectional view (part 16) showing the manufacturing procedure of the printed wiring board 10.
Figure 18:
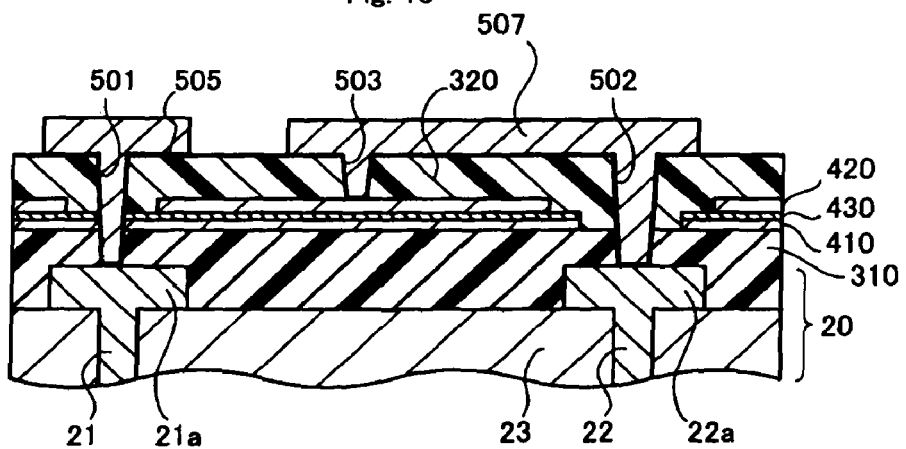
FIG. 18 is a cross-sectional view (part 17) showing the manufacturing procedure of the printed wiring board 10.

Subsequently, an electroless plating catalyst was applied to the part of the thermosetting resin sheet 320 which is exposed to the outside (including the inner walls of the holes 501 to 503), and then the sheet 320 was immersed in an electrolytic copper plating aqueous solution, thereby forming electroless copper plated film 505 of 0.6 to 3.0 μm in thickness (see FIG. 15). Next, dry film as a photosensitive resist was laminated on the whole surface of the electroless copper plated film 505, and then exposed to light through a pattern mask and developed, thereby forming a patterned resist 506 (see FIG. 16). Then, electrolytic copper plated film 507 was formed on the part of the electroless copper plated film 505 which was exposed to the outside (including the inner walls of the holes 501 to 503) (see FIG. 17), the patterned resist 506 was removed (see FIG. 18), and the part of the electroless copper plated film 505 which was exposed to the surface was removed by etching (see FIG. 19), whereby the respective holes 501 to 503 were filled with copper and also the copper wire pattern was formed on the exposed part of the thermosetting resin sheet 320.

Figure 19:
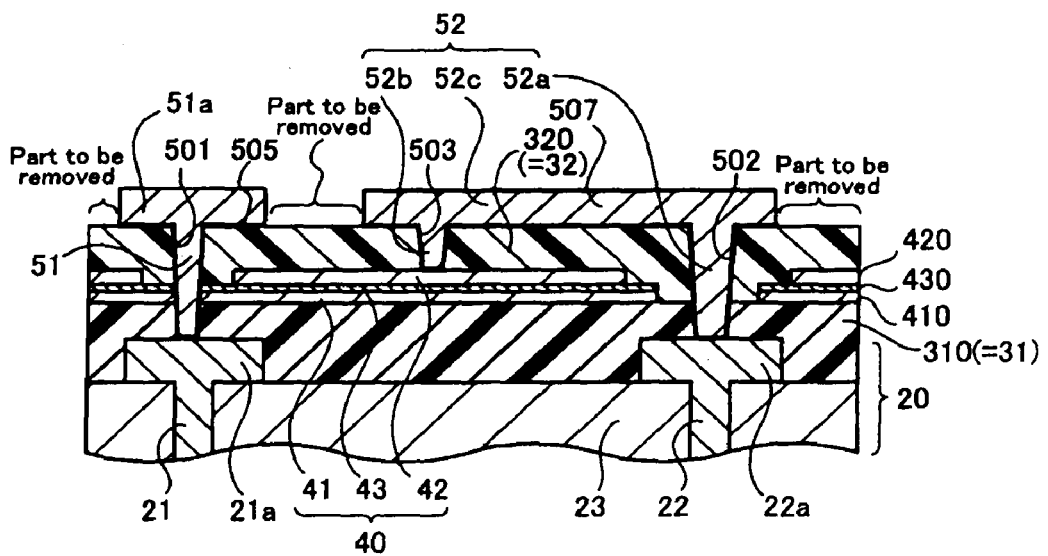
FIG. 19 is a cross-sectional view (part 18) showing the manufacturing procedure of the printed wiring board 10.

In FIG. 19, the thermosetting resin sheets 310 and 320 (for example, ABF-45SH produced by Ajinomoto Co., Inc.) correspond to the first electrical insulating layer 31 and the second electrical insulating layer 32, respectively, the copper foil 410, the copper foil 420 and the high dielectric layer 430 of the high dielectric capacitor sheet 400 correspond to the lower electrode 41, the upper electrode 42 and the high dielectric layer 43 of the capacitor portion 40, respectively, copper filled in the lower electrode connecting hole 501 and the copper wire pattern on the second electrical insulating layer 32 connected to the copper correspond to the lower electrode connecting portion 51 and the wire pattern 51a, respectively, and copper filled in the upper electrode connecting first hole 502, copper filled in the upper electrode connecting second hole 503 and the copper wire pattern on the second electrical insulating layer 32 for connecting them correspond to the upper electrode connecting portion first parts 51a to 52c, respectively.

According to the printed wiring board 10 described above in detail, even when in process of build-up, the substantially whole surface of the plate surface of the wired board is covered by the high dielectric capacitor sheet 400 having the structure that the high dielectric layer 430 is sandwiched between the two copper foils 410 and 420, which will afterwards serve as the capacitor portion 40, the lower electrode connecting portion 51 and the upper electrode connecting portion 52 can be formed thereafter.

Furthermore, the printed wiring board is generally built up under the temperature condition of 200° C. or less, and thus it is difficult to make high dielectric material ceramic material by firing the high dielectric material at high temperatures (for example, 600 to 950° C.) in process of build-up. Therefore, it is preferable to form the capacitor portion 40 by using a high dielectric capacitor sheet having the structure that a high dielectric layer 430 which has already been fired in advance is sandwiched by two copper foils 410 and 420.

Furthermore, the upper electrode connecting portion 52 is electrically connected to the power supply terminal 74 of the semiconductor device 70, and the lower electrode connecting portion 51 is electrically connected to the ground terminal 72 of the semiconductor device 70. Therefore, a sufficient decoupling effect can be exhibited even under such a situation that the on/off frequency of the semiconductor device 70 is as high as several GHz to several tens GHz and thus instantaneous reduction is liable to occur.

Still furthermore, the high electric layer 43 of the capacitor portion 40 is formed by firing barium titanate having a large dielectric constant or the like, and the areas of the upper electrode 42 and the lower electrode 41 of the capacitor portion 40 are larger as they cover the substantially whole surface of the plate surface as solid patterns, and also the interval of both the electrodes 41 and 42 is as small as 0.1 to 10 μm, so that the electrical capacitance of the capacitor portion 40 is increased and the sufficient decoupling effect can be easily obtained.

As compared with a case where a chip capacitor is disposed around the semiconductor device 70, the wire pull-out distance can be shortened and occurrence of noise can be suppressed because the capacitor portion 40 is disposed almost directly below the semiconductor device 70.

The present invention is not limited to the above embodiment, and various modifications may be implemented without departing from the technical scope of the present invention.

In the above-described embodiment, the capacitor portion 40 is formed by using the high dielectric capacitor sheet 400. However, in place of use of the high dielectric capacitor sheet 400, the upper electrode connecting portion 52 and the lower electrode connecting portion 51 may be formed in the same manner as the above-described embodiment after metal foil, a high dielectric layer of ceramic material and metal foil are laminated in this order on the first electrical insulating layer 31 formed on the upper surface of the build-up portion 20 so as to cover the whole surface. In this case, the capacitor portion 40 can also be formed in process of the build-up.

Furthermore, in the above-described embodiment, the lower electrode 41 of the capacitor portion 40 is connected to the ground terminal 72 of the semiconductor device 70 and the ground conductor 21 of the build-up portion 20, and the upper electrode 42 is connected to the power supply terminal 74 and the power supply conductor 22. However, conversely, the lower electrode 41 may be connected to the power supply terminal 74 and the power supply conductor 22, and also the upper electrode 42 may be connected to the ground terminal 72 and the ground conductor 21.

Still furthermore, in the above-described embodiment, the printed wiring board 10 containing the capacitor portion 40 was described. However, in addition to the thus contained capacitor portion 40, a chip capacitor may be mounted on the mount surface 60. With this construction, when insufficient electrical capacity is achieved by only the capacitor portion 40 or the like, it can be compensated by the chip capacitor mounted on the mount surface 60. At this time, when the plus terminal of the chip capacitor is connected to the power supply electrode of the capacitor portion 40 and the minus terminal of the chip capacitor is connected to the ground electrode of the capacitor portion, the impedance of the route extending from the chip capacitor to the IC chip decreases, and thus power loss is reduced. Therefore, this construction is preferable.

EXAMPLES

Examples 1 to 9

The examples shown in Table 1 were manufactured according to the above-described embodiment. Specifically, in the process shown in FIG. 6, the ratio of the number of ground pads 62 and the number of resist opening portions 312-1 (lower electrode connecting portions 51) were set to 1:0.1, and also the ratio of the number of power supply pads 64 and the number of resist opening portions 312-2 (the upper electrode connecting portion first parts 52*a*) was set to 1:0.1. Furthermore, by adjusting the sizes of the opening portions 312-1 and 312-2, 314-1 and 314-2 shown in FIG. 9, the confronting area of the lower electrode 41 and the upper electrode 41 was set in the range from $3.22 \times 10^{-5}$ m$^2$ to $1.83 \times 10^{-3}$ m$^2$. As a result, the capacitance of the capacitor portion was equal to $0.44 \times 10^{-6}$ F to $25 \times 10^{-6}$ F. In this case, a plurality of ground terminals 72 of the IC chip 70 were electrically connected to one lower electrode connecting portion 51, and a plurality of power supply terminals 74 of the IC chip 70 were electrically connected to one upper electrode connecting portion first part 52*a*.

Example 10

In the above-described embodiment, the size of the high dielectric capacitor sheet 400 was set to 49.5 mm×43 mm, the ratio of the number of ground pads 62 and the number of lower electrode connecting portions 51 was set to 1:1, and the ratio of the number of power supply pads 64 and the number of upper electrode connecting portion first parts 52*a* was set to 1:1. The number of ground pads 62 and the number of power supply pads 64 were set to 11000. The size of each opening portion 312-1 and 312-2 was set in the range from 300 to 400 μmϕ). As a result, the capacitance of the capacitor portion was equal to $0.18 \times 10^{-6}$ F.

Example 11

In the example 10, the ratio of the number of ground pads 62 and the number of lower electrode connecting portions 51 was set to 1:0.7, and the ratio of the number of power supply pads 64 and the number of upper electrode connecting portion first parts 52*a* was set to 1:0.7. As a result, the capacitance of the capacitor portion was set to $8.8 \times 10^{-6}$ F.

Example 12

In the example 10, the ratio of the number of ground pads 62 and the number of lower electrode connecting portions 51 was set to 1:0.5, and the ratio of the number of power supply pads 64 and the number of upper electrode connecting portion first parts 52*a* was set to 1:0.5. As a result, the capacitance of the capacitor portion was equal to $15 \times 10^{-6}$ F.

Example 13

In the example 10, the ratio of the number of ground pads 62 and the number of lower electrode connecting portions 51 was set to 1:0.1, and the ratio of the number of power supply pads 64 and the upper electrode connecting portion first parts 52*a* was also set to 1:0.1. As a result, the capacitance of the capacitor portion was equal to $26 \times 10^{-6}$ F.

Example 14

In the example 10, the ratio of the number of ground pads 62 and the number of lower electrode connecting portions 51 was set to 1:0.05, and the ratio of the number of power supply pads 64 and the number of upper electrode connecting portion first parts 52*a* was set to 1:0.05. As a result, the capacitance of the capacitor portion was equal to $27.5 \times 10^{-6}$ F.

Example 15

In the example 10, the ratio of the number of ground pads 62 and the number of lower electrode connecting portions 51 was set to 1:0.03, and the ratio of the number of power supply pads 64 and the number of upper electrode connecting portion first parts 52*a* was also set to 1:0.03. As a result, the capacitance of the capacitor portion was equal to $28 \times 10^{-6}$ F.

Example 16

In the example 10, the ratio of the number of ground pads 62 and the number of lower electrode connecting portions 51 was set to 1:0.01, and the ratio of the number of power supply pads 64 and the number of upper electrode connecting portion first parts 52*a* was also set to 1:0.01. As a result, the capacitance of the capacitor portion was equal to $29 \times 10^{-6}$ F.

Example 17

This example was manufactured according to the example 6. Specifically, in the manufacturing of the high dielectric capacitor sheet 400, the repetitive frequency of spin-coat/dry/firing was set to one time. As a result, the thickness of the high dielectric layer 430 was equal to 0.03 μm.

Example 18

This example was manufactured according to the example 6. Specifically, in the manufacturing of the high dielectric capacitor sheet 400, the repetitive frequency of spin-coat/dry/firing was set to four times. As a result, the thickness of the high dielectric layer 430 was equal to 0.12 μm.

Example 19

This example was manufactured according to the example 6. Specifically, in the manufacturing of the high dielectric capacitor sheet 400, the repetitive frequency of spin-coat/dry/firing was set to 15 times. As a result, the thickness of the high dielectric layer 430 was equal to 0.44 μm.

Example 20

This example was manufactured according to the example 6. Specifically, in the manufacturing of the high dielectric capacitor sheet 400, the repetitive frequency of spin-coat/dry/firing was set to 200 times. As a result, the thickness of the high dielectric layer 430 was equal to 6 μm.

Example 21

This example was manufactured according to the example 6. Specifically, in the manufacturing of the high dielectric capacitor sheet 400, the repetitive frequency of spin-coat/dry/firing was set to 330 times. As a result, the thickness of the high dielectric layer 430 was equal to 9.9 μm.

Example 22

This example was manufactured according to the example 6. Specifically, in the manufacturing of the high dielectric capacitor sheet 400, the repetitive frequency of spin-coat/dry/firing was set to 500 times. As a result, the thickness of the high dielectric layer 430 was equal to 15 μm.

Example 23

A chip capacitor was mounted on the surface of the printed wiring board of the example 1, and the connection between the chip capacitor and the ground terminal, the power supply terminal of the IC chip was carried out via the capacitor portion 40 contained in the printed wiring board.

Comparative Example

A high dielectric capacitor sheet of a comparative example was manufactured on the basis of the manufacturing process of the modification of the high dielectric capacitor sheet described with reference to the embodiment. However, the electrode was formed on the unfired layer after drying with no firing. As a result, the electrostatic capacitance just below the die was less than 0.001 μF.

(Evaluation Test 1)

The following IC chips were mounted on the printed wiring boards of the examples 1 to 16, 23 and the comparative example. The simultaneous switching was repeated at 100 times, and the presence or absence of malfunction was checked by using a pulse pattern generator/error detector (produced by Advantest Corporation, name of product: D3186/3286). When there was no malfunction, it was indicated as a good product "O (circle)," and when there was some malfunction, it was indicated as a defective product "X (cross)."

(1) Clock Frequency: 1.3 GHz, FSB: 400 MHz
(2) Clock Frequency: 2.4 GHz, FSB: 533 MHz
(3) Clock Frequency: 3.0 GHz, FSB: 800 MHz
(4) Clock Frequency: 3.73 GHz, FSB: 1066 MHz From the comparison in the estimation result between each example and the comparative example in which the IC chip was of (1) was mounted, it has been found that malfunction hardly occurs by equipping the capacitor portion with the dielectric layer of ceramic material. Furthermore, from the estimation results in which the IC chips of (2) to (4) were mounted, it has been found that occurrence of malfunction is more unlikely as the capacitance of the capacitor is larger, and if it is set to 0.8 μF or more, no malfunction occurs even when an IC chip having a high frequency of 3.0 GHz or more is mounted.

Figure 20:
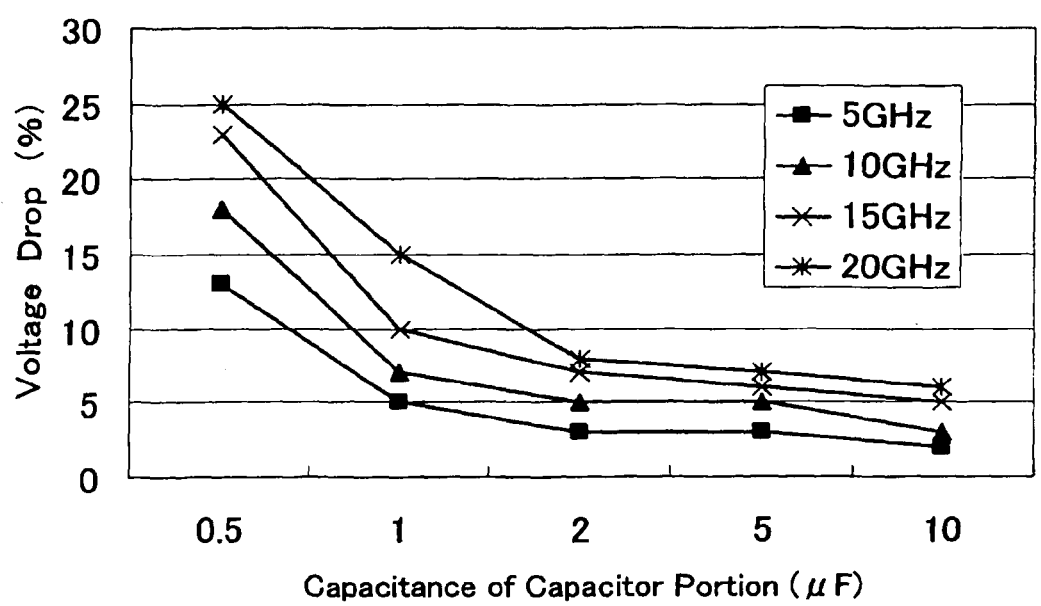
FIG. 20 is a graph showing a simulation result of the relationship between the capacitance of a capacitor portion and voltage drop of an IC chip every driving frequency of an IC chip.
Figure 21:
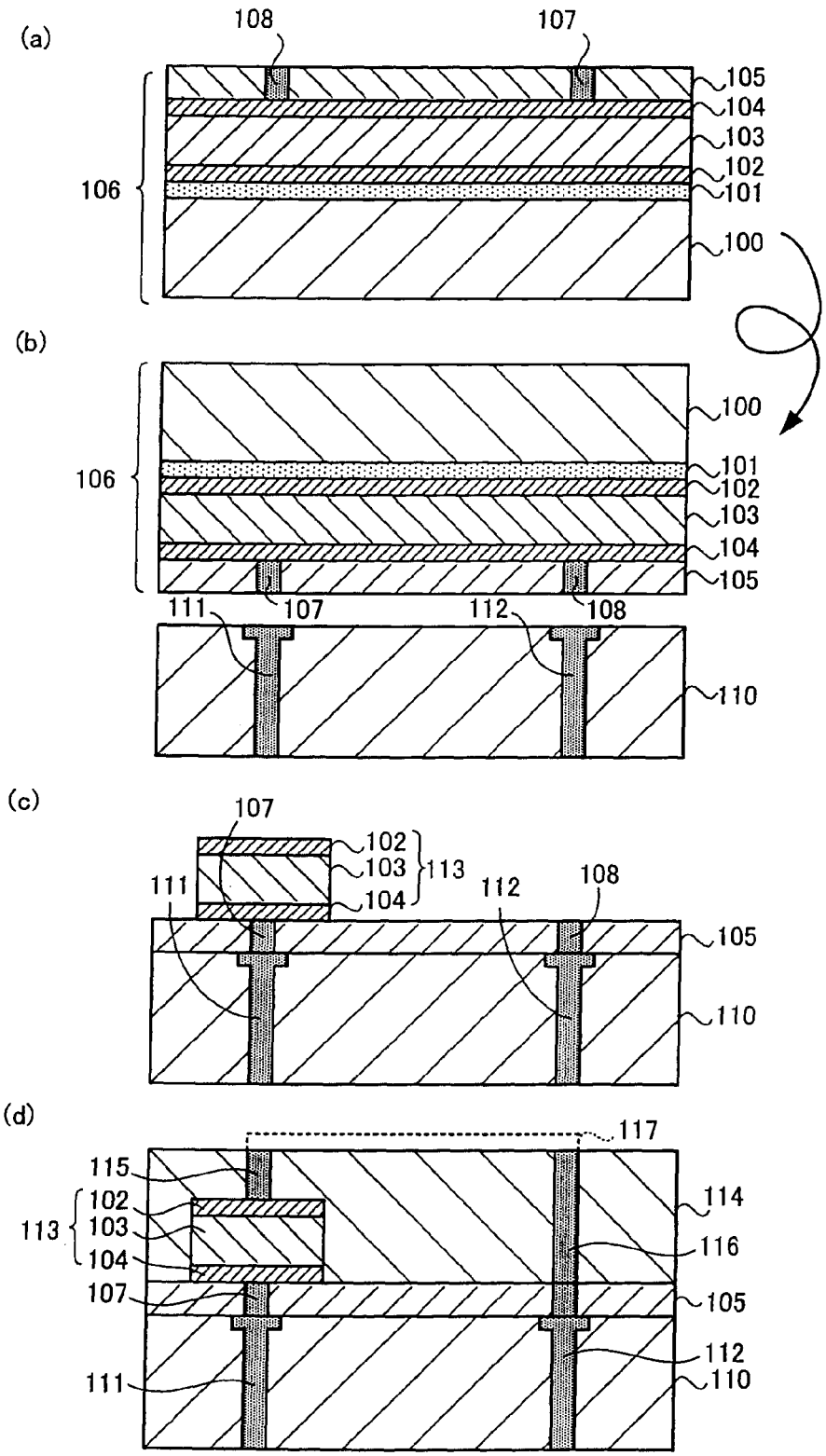
FIG. 21 is a diagram showing a conventional art.

Furthermore, with respect to the printed wiring boards of the respective examples, a circuit which could measure the voltage of the IC chip was provided to each printed wiring board, and the voltage drop of the IC chip was measured at the simultaneous switching time. The relationship between the capacitance of the capacitor portion and the voltage drop of the IC chip was simulated every driving frequency of the IC chip. This result is shown in FIG. 20. The abscissa axis represents the capacitance of the capacitor of the capacitor portion, and the ordinate axis represents the voltage drop amount (%) of each driving voltage. From this simulation result, when the voltage drop amount exceeds 10%, malfunction may occur.

(Evaluation Test 2)

One heat cycle was set to −55° C.×5 minutes, 125° C.×5 minutes, and 1000 cycles were repetitively carried out on each of the printed wiring boards of the examples 4, 17 to 22. The connection resistance of a specific circuit which was connected from a terminal at the opposite side to the IC chip mount surface via the IC to a terminal at the opposite side to the IC chip mount surface (a terminal different from the terminal at the opposite side) was measured before the heat cycle test, at the 500-th cycle and at 1000-th cycle to determine the resistance variation rates of the following equation. When the resistance variation rate was within ±10%, it was indicated as success "O (circle)," and when the resistance variation rate exceeds ±10%, it was indicated as defective "X (cross)," and the result is shown in Table 1.

Resistance variation rate=(connection resistance after heat cycle−connection resistance before heat cycle)/connection resistance before heat cycle×100(%)

From the test result, it is found that when the thickness of the high dielectric layer of the capacitor portion is excessively small or excessively large, the connection reliability is liable to be lowered. The reason is not clear. However, when the high dielectric layer is excessively thin (that is, 0.03 μm or less), it is estimated that cracks occur in the ceramic high dielectric layer due to thermal contraction of the printed wiring board, and the wiring of the printed wiring board is broken. On the other hand, if the high dielectric layer of the capacitor portion is excessively thick (that is, exceed 9.9 μm), it is estimated that the ceramic high dielectric layer and the upper electrode/the lower electrode are different in the thermal expansion coefficient, and thus the difference in the contraction/expansion amount between the high dielectric layer and the upper electrode/lower electrode in the horizontal direction of the printed wiring board is increased, so that exfoliation occurs between the capacitor portion and the printed wiring board and the wire of the printed wiring board is broken.

(Evaluation Test 3)

The same heat cycle test as the evaluation test 2 was carried out on the printed wiring boards of the examples 10 to 16 at 500 cycles and 1000 cycles. After the heat cycle, the IC chip (clock frequency: 3.73 GHz, FSB: 1066 MHz) was mounted, and the presence or absence of the malfunction was checked in the same manner as the evaluation test 1. The result is shown in table 1.

From this test result, it has been found that the malfunction is liable to occur when the ratio of the number of electrode connecting portions to the number of pads, that is, (the number of electrode connecting portions/the number of pads) is excessively small or excessively large. The reason is not clear, however, it is estimated as follows. That is, when this ratio is excessively small (that is, less than 0.03), the number of electrode connecting portions (the lower electrode connecting portions 51 and the upper electrode connecting portion first parts 52a) is excessively small. Therefore, when the electrical connection state of these elements is degraded, this effect is not covered by the other electrode connecting portions and thus the malfunction is liable to occur. On the other hand, when the ratio is excessively large (that is, exceeding 0.7), the reason is estimated as follows. With respect to the lower electrode 41 and the upper electrode 42, the number of portions over which the respective electrode connecting portions pass under the non-contact state is increased, and the contraction/expansion of the fragile high dielectric layer 43 of ceramic material is liable to occur due to the difference in thermal expansion between the resin filled at those portions and the high dielectric layer 43, so that cracks occur in the high dielectric layer 43.

capacitor portion without contact and passing through the ceramic high dielectric layer and lower electrode of the capacitor portion such that the lower electrode connecting portion directly penetrates through the ceramic high dielectric layer of the capacitor portion and is electrically connected to the lower electrode in contact, wherein one of the upper and lower electrodes of the capacitor portion comprises a metal foil and the other one of the upper and lower electrodes of the capacitor portion comprises a plated film.

2. The printed wiring board according to claim 1, wherein the capacitor portion is formed by laminating a separately-formed high-dielectric capacitor sheet having the same size as the first insulating layer and the second insulating layer.

TABLE 1

| Example | Thickness of high dielectric layer (μm) | Number of lower electrode connecting portion 51/pad number | Number of first part 52a/pad number | Area of upper and lower electrodes (m²) | Capacitance of capacitor (F) | Chip capacitor | Evaluation test 1 Mounted 1C chip ① | ② | ③ | ④ | Evaluation test 2 - cycles 500 | 1000 | Evaluation test 3 - cycles 500 | 1000 |
|---|---|---|---|---|---|---|---|---|---|---|---|---|---|---|
| 1 | 1.2 | 0.1 | 0.1 | $3.22 \times 10^{-5}$ | $0.44 \times 10^{-6}$ | None | ○ | X | X | X | — | — | — | — |
| 2 | 1.2 | 0.1 | 0.1 | $3.67 \times 10^{-5}$ | $0.5 \times 10^{-6}$ | None | ○ | ○ | X | X | — | — | — | — |
| 3 | 1.2 | 0.1 | 0.1 | $5.86 \times 10^{-5}$ | $0.8 \times 10^{-6}$ | None | ○ | ○ | ○ | X | — | — | — | — |
| 4 | 1.2 | 0.1 | 0.1 | $7.33 \times 10^{-5}$ | $1 \times 10^{-6}$ | None | ○ | ○ | ○ | ○ | ○ | ○ | — | — |
| 5 | 1.2 | 0.1 | 0.1 | $1.47 \times 10^{-4}$ | $2 \times 10^{-6}$ | None | ○ | ○ | ○ | ○ | — | — | — | — |
| 6 | 1.2 | 0.1 | 0.1 | $3.67 \times 10^{-4}$ | $5 \times 10^{-6}$ | None | ○ | ○ | ○ | ○ | — | — | — | — |
| 7 | 1.2 | 0.1 | 0.1 | $7.33 \times 10^{-4}$ | $10 \times 10^{-6}$ | None | ○ | ○ | ○ | ○ | — | — | — | — |
| 8 | 1.2 | 0.1 | 0.1 | $1.47 \times 10^{-3}$ | $20 \times 10^{-6}$ | None | ○ | ○ | ○ | ○ | — | — | — | — |
| 9 | 1.2 | 0.1 | 0.1 | $1.83 \times 10^{-3}$ | $25 \times 10^{-6}$ | None | ○ | ○ | ○ | ○ | — | — | — | — |
| 10 | 1.2 | 1 | 1 | — | $0.18 \times 10^{-6}$ | None | ○ | X | X | X | — | — | X | X |
| 11 | 1.2 | 0.7 | 0.7 | — | $8.8 \times 10^{-6}$ | None | ○ | ○ | ○ | ○ | — | — | ○ | X |
| 12 | 1.2 | 0.5 | 0.5 | — | $15 \times 10^{-6}$ | None | ○ | ○ | ○ | ○ | — | — | ○ | ○ |
| 13 | 1.2 | 0.1 | 0.1 | — | $26 \times 10^{-6}$ | None | ○ | ○ | ○ | ○ | — | — | ○ | ○ |
| 14 | 1.2 | 0.05 | 0.05 | — | $27.5 \times 10^{-6}$ | None | ○ | ○ | ○ | ○ | — | — | ○ | ○ |
| 15 | 1.2 | 0.03 | 0.03 | — | $28 \times 10^{-6}$ | None | ○ | ○ | ○ | ○ | — | — | ○ | X |
| 16 | 1.2 | 0.01 | 0.01 | — | $29 \times 10^{-6}$ | None | ○ | ○ | ○ | ○ | — | — | X | X |
| 17 | 0.03 | 0.1 | 0.1 | $3.67 \times 10^{-4}$ | — | None | — | — | — | — | X | X | — | — |
| 18 | 0.12 | 0.1 | 0.1 | $3.67 \times 10^{-4}$ | — | None | — | — | — | — | ○ | X | — | — |
| 19 | 0.45 | 0.1 | 0.1 | $3.67 \times 10^{-4}$ | — | None | — | — | — | — | ○ | ○ | — | — |
| 20 | 6 | 0.1 | 0.1 | $3.67 \times 10^{-4}$ | — | None | — | — | — | — | ○ | ○ | — | — |
| 21 | 9.9 | 0.1 | 0.1 | $3.67 \times 10^{-4}$ | — | None | — | — | — | — | ○ | X | — | — |
| 22 | 15 | 0.1 | 0.1 | $3.67 \times 10^{-4}$ | — | None | — | — | — | — | X | X | — | — |
| 23 | 1.2 | 0.1 | 0.1 | $3.22 \times 10^{-5}$ | $0.44 \times 10^{-6}$ | Mounted | ○ | ○ | ○ | ○ | — | — | — | — |
| Comparative Example | | | | | $<0.01 \times 10^{-6}$ | None | X | X | X | X | — | — | — | — |

This application is based upon and claims the benefit of priority from the prior Japanese Patent Application No. 2004-188855, filed on Jun. 25, 2004, the entire contents of which are incorporated herein by reference.

What is claimed is:

1. A printed wiring board comprising:
   a first insulating layer;
   a second insulating layer formed over the first insulating layer;
   a capacitor portion comprising an upper electrode, a lower electrode and a ceramic high dielectric layer formed between the upper electrode and the lower electrode, the capacitor portion sandwiched by the first insulating layer and the second insulating layer;
   an upper electrode connecting portion having a non-contact portion and a contact portion, the non-contact portion passing through the capacitor portion without contact and through the second insulating layer, the contact portion being electrically connected to the upper electrode of the capacitor portion; and
   a lower electrode connecting portion passing through the second insulating layer and the upper electrode of the 3. The printed wiring board according to claim 1, wherein the upper electrode connecting portion is electrically connected to one of a power supply terminal and ground terminal of a semiconductor element, and the lower electrode connecting portion is electrically connected to the other one of the ground terminal and the power supply terminal.

4. The printed wiring board according to claim 3, wherein the upper electrode connecting portion has a lower end electrically connected to one of a power supply conductor and a ground conductor, and the lower electrode connecting portion is electrically connected to one of the ground terminal and the power supply terminal of the semiconductor element and has a lower end electrically connected to the other one of the ground conductor and the power supply terminal.

5. The printed wiring board according to claim 1, wherein the high dielectric layer is manufactured by firing a raw material comprising at least one metal oxide selected from the group consisting of barium titanate, strontium titanate, tantalum oxide, lead zirconate titanate, lead lanthanum zirconate titanate, lead niobium zirconate titanate, lead calcium zirconate titanate, and lead strontium zirconate titanate.

6. The printed wiring board according to claim 1, wherein the upper electrode and the lower electrode are formed as solid patterns.

7. The printed wiring board according to claim 1, wherein the upper electrode and the lower electrode in the capacitor portion is separated by a distance of 10 μm or less.

8. The printed wiring board according to claim 1, wherein the ceramic high dielectric layer of the capacitor portion has a thickness which is 10 μm or less.

* * * * *